United States Patent [19]

Philipossian

[11] Patent Number: 5,064,367

[45] Date of Patent: Nov. 12, 1991

[54] CONICAL GAS INLET FOR THERMAL PROCESSING FURNACE

[75] Inventor: Ara Philipossian, Stoneham, Mass.

[73] Assignee: Digital Equipment Corporation, Maynard, Mass.

[21] Appl. No.: 563,937

[22] Filed: Aug. 6, 1990

[51] Int. Cl.$^5$ .................. F27D 7/00; F27B 17/00
[52] U.S. Cl. .................... 432/253; 432/5; 432/6; 432/11; 118/725; 118/715
[58] Field of Search .......... 432/5, 6, 11, 152, 253, 432/72, 2, 99; 118/715, 725; 156/345

[56] References Cited

U.S. PATENT DOCUMENTS

| | | | |
|---|---|---|---|
| 3,338,209 | 8/1967 | Bhola | 118/49.5 |
| 4,348,580 | 9/1982 | Drexel | 219/390 |
| 4,449,037 | 5/1984 | Shibamata et al. | 219/388 |
| 4,543,059 | 9/1985 | Whang et al. | 432/11 |
| 4,645,977 | 2/1987 | Kurokawa et al. | 315/111.21 |
| 4,650,539 | 3/1987 | Irvine et al. | 156/613 |
| 4,711,989 | 12/1987 | Yu | 219/290 |
| 4,732,110 | 3/1988 | Parsons | 118/725 X |

Primary Examiner—Henry A. Bennett
Assistant Examiner—Christopher B. Kilner
Attorney, Agent, or Firm—Arnold, White & Durkee

[57] ABSTRACT

A tube furnace used for high-temperature processing of semiconductor wafers or the like employs a cone-like shape for the gas inlet or nozzle where the reactant or insert gas enters the furnace tube. This conical nozzle produces a gas flow of faster velocities, following the flow streamlines, and avoids or minimizes recirculating gas cells. The amount of gas used in purging a tube with this configuration is reduced, and the time needed for thorough purging is also reduced. Greater process control, and enhanced process reproducibility, are also possible because of the reduction in overlap of process steps permitted by the faster purging. This feature of faster purging can, in addition, reduce the infiltration of ambient air which occurs during any processing step.

12 Claims, 2 Drawing Sheets

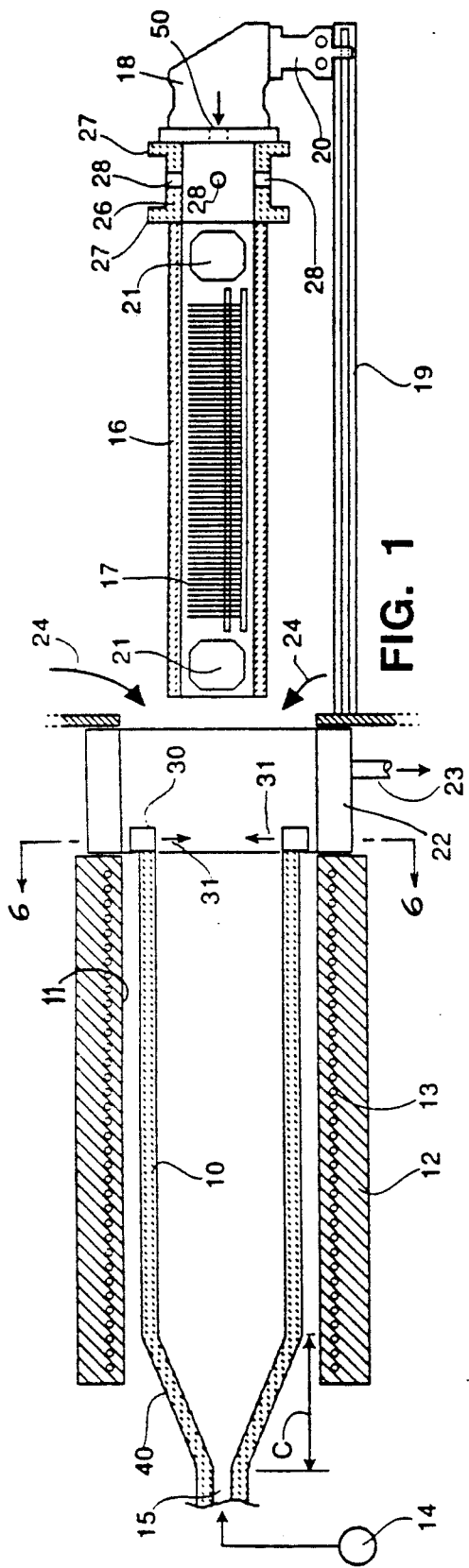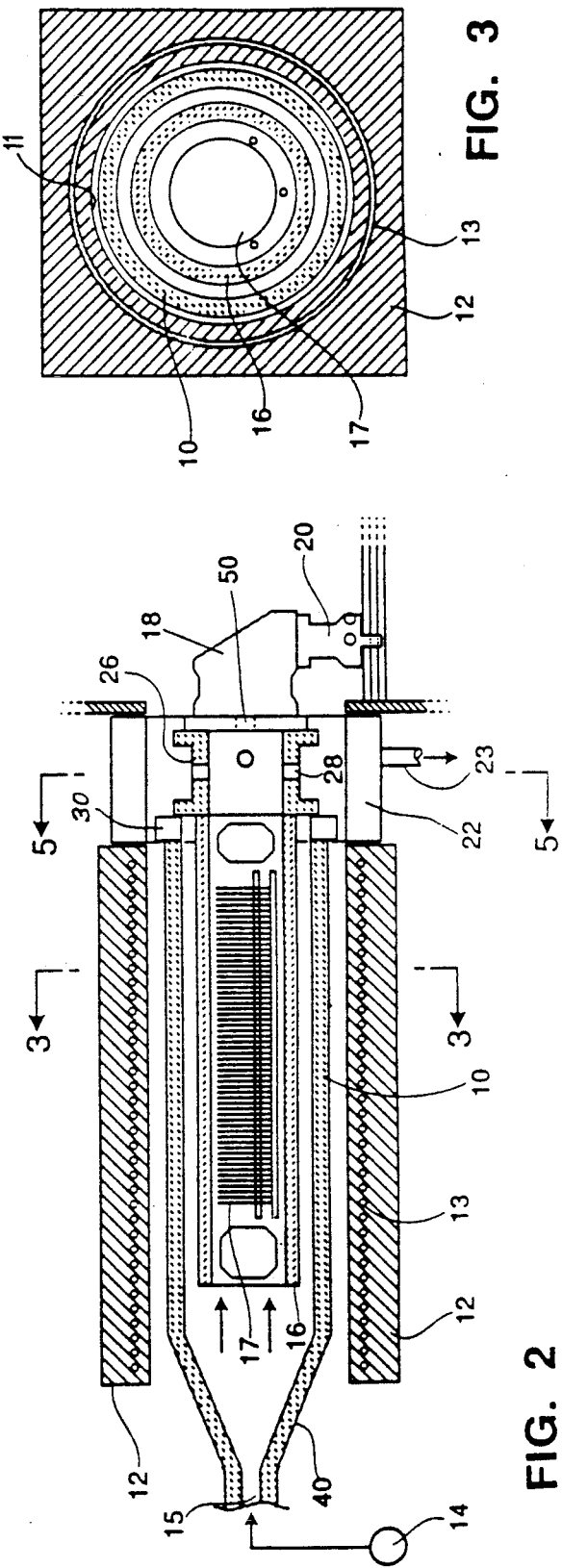
FIG. 1
FIG. 2
FIG. 3

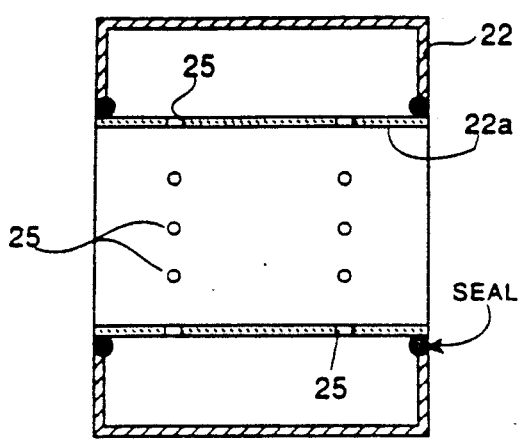
FIG. 4
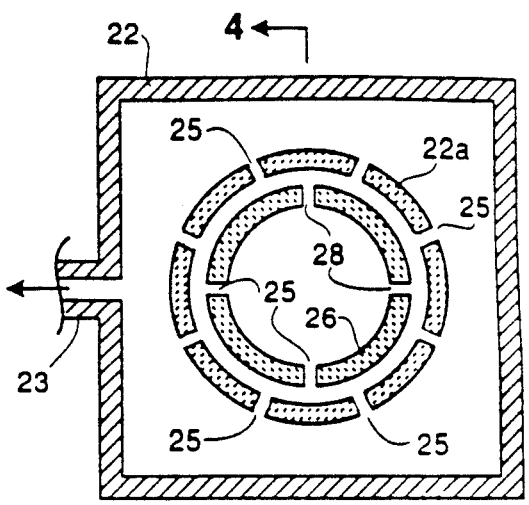
FIG. 5
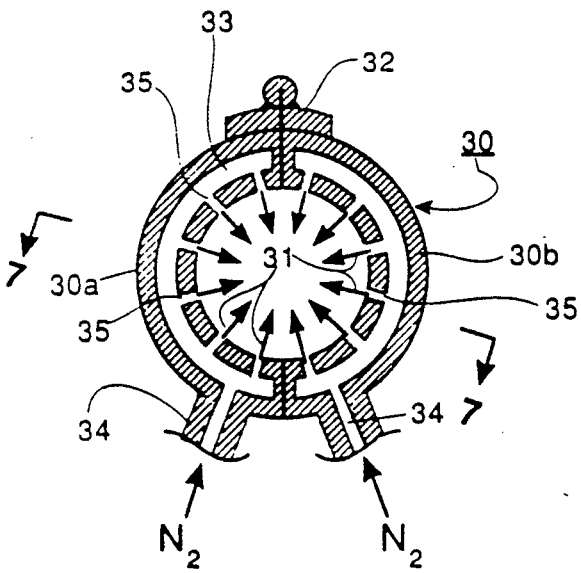
FIG. 6
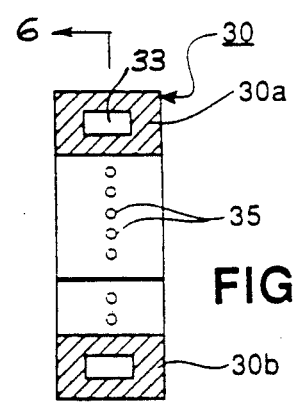
FIG. 7
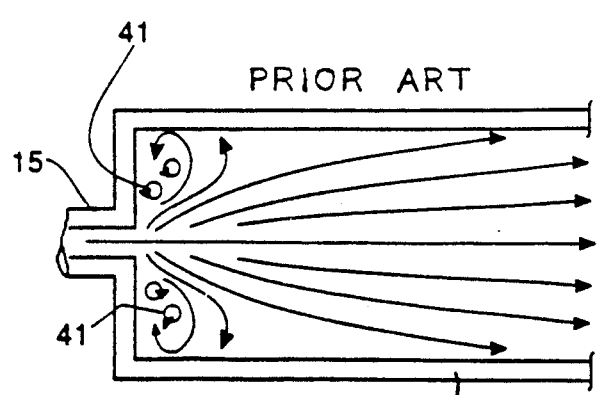
PRIOR ART
FIG. 8
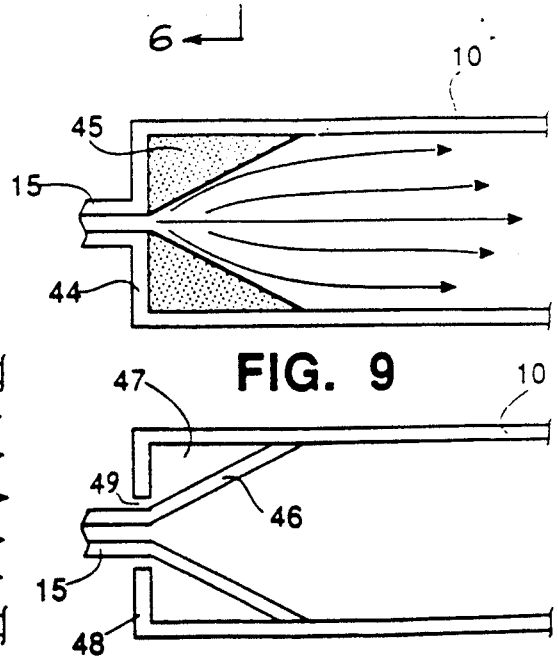
FIG. 9
FIG. 10

CONICAL GAS INLET FOR THERMAL PROCESSING FURNACE

RELATED CASES

This application discloses subject matter also disclosed in my copending patent application Ser. Nos. 372,663 and 372,669, now U.S. Pat. Nos. 4,992,044 and 4,950,156 respectively assigned to Digital Equipment Corporation, assignee of this invention.

BACKGROUND OF THE INVENTION

This invention relates to semiconductor processing equipment, and more particularly to apparatus for performing high-temperature processes upon semiconductor wafers in a tube furnace.

Various types of thermal processing equipment are available commercially. During a process cycle, several boats containing silicon or other kind of wafers, supported by some kind of rod, are inserted into the furnace where the desired process is performed. Upon completion of the process cycle, the wafers are removed from the furnace and unloaded from the supporting rod. During the insertion and removal steps of the process, it is preferred that the wafers be protected from exposure to ambient air. Oxygen, water vapor and airborne particulates found in ambient air can react with the wafers and adversely affect their chemical and physical properties. One very convenient apparatus to do this has been described in U.S. Pat. Nos. 4,459,104 to Wollman and 4,543,059 to Whang et al, which describe a tubular cantilever into which the loaded wafer boats are inserted. By means of the tube, the wafers are protected against particulates, and, by flowing an inert gas through the tube, also protected from moisture and air. This is particularly important during the cantilever insertion and removal steps of a typical thermal process cycle. The tubular cantilever also reduces the amount of contaminants seen by the wafers inside the furnace tube itself since the wafer is isolated by the tubular cantilever from the furnace tube.

Further, it is important that the reaction or other processing step being performed on the wafers be carried out uniformly on all the wafers being processed, and uniformly across the surface of each wafer. Various furnace design changes have been made to assure a uniform flow of the reaction gases through the furnace tube to prevent contaminants from entering the reaction tube and adversely affecting the wafers, and to ensure efficient removal of the gases fed to the furnace.

Previously, the nozzle sections of oxidation tubes (such as the furnace tubes discussed above for semiconductor wafer processing) have been configured with 90° angle inlet ports, i.e., with sidewalls at the end of the oxidation tube perpendicular to the axis of the tube. Other configurations use an incomplete hemi-spherical section between the inlet port and the oxidation tube. In either case, the transition section between the gas inlet and the main part of the oxidation tube exhibits rather abrupt geometries. These abrupt geometries tend to cause recirculating gas cells in the entrance region of the oxidation tube. Further, purging an oxidation tube having a gas flow characteristic exhibited by abrupt geometries is more difficult, requiring longer times and using excess amounts of purge gas; in addition, purging is less thorough, thus resulting in growth rate and compositional non-uniformaties of the oxide film and consequently giving rise to poorer device yields.

SUMMARY OF THE INVENTION

In accordance with one embodiment of the invention, a tube furnace used for high-temperature processing of semiconductor wafers or the like employs a conelike shape for the gas inlet or nozzle where the reactant or inert gas enters the furnace tube. This conical nozzle produces a gas flow of faster velocities, following the flow streamlines, and avoids or minimizes the formation of recirculating gas cells. The amount of gas used in purging a tube with this configuration is reduced, and the time needed for thorough purging is also reduced. Greater process control, and enhanced process reproducability, are also made possible because of the reduction in overlap of process steps permitted by the faster purging. This feature of faster purging can, in addition, reduce the infiltration and residence time of ambient air into the reactor which occurs during any processing step.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment, i.e., a tubular cantilever system, which follows, when read in conjunction with the accompanying drawings, wherein:

FIG. 1 is an elevation view in section of an atmospheric thermal processing furnace having a tubular cantilever in which features of the invention may be implemented, the furnace in this view being in a condition where the tubular cantilever is outside the furnace;

FIG. 2 is an elevation view in section of the furnace of FIG. 1, the furnace in this view being in a condition where the tubular cantilever is inside the furnace;

FIG. 3 is an elevation view in section of the apparatus of FIG. 2, taken along the line 3—3 in FIG. 2;

FIG. 4 is a perspective view of the scavenger box of FIGS. 1 and 2;

FIG. 5 is an elevation view in section of the scavenger box seen in FIGS. 1, 2 and 4, taken along the line 5—5 in FIG. 2;

FIG. 6 is an elevation view in section of the annular collar-shaped manifold 30 seen in FIGS. 1 and 2, taken along the line 6—6 in FIG. 1;

FIG. 7 is an elevation view in section of the collar 30 seen in FIGS. 1, 2 and 6, taken along the line 7—7 in FIG. 6;

FIG. 8 is an elevation view in section of a gas inlet nozzle for a tube furnace according to the prior art;

FIG. 9 is an elevation view in section of a gas inlet nozzle for a tube furnace according to an alternative method of construction for one embodiment of the invention; and FIG. 10 is an elevation view in section of a gas inlet nozzle for a tube furnace according to another alternative method of construction.

DETAILED DESCRIPTION OF SPECIFIC EMBODIMENT

Although the following description and the Drawing refer specifically to one embodiment of a furnace of the invention having a tubular cantilever for carrying the wafers, the conical inlet of the invention can be used with any other thermal processing furnace, as will be known to one skilled in the art.

Referring to FIGS. 1, 2 and 3, a furnace for processing semiconductor wafers is illustrated according to features of one embodiment of the invention. This assembly includes an elongated cylindrical quartz furnace tube 10 located inside a cylindrical opening 11 of a diffusion furnace 12. The diffusion furnace 12 includes heater elements 13 of the resistance type functioning to raise the temperature within the furnace to an elevated level of perhaps 800° C. to about 1150° C. for performing some step of a semiconductor manufacturing process, such as diffusion, LPCVD (low pressure chemical vapor deposition), oxide growth, annealing, or the like. A source 14 of reactant or inert gas is connected to an inlet 15 at one end of the tube 10 to provide the desired atmosphere within the tube at various times in the operating cycle. Since the apparatus in one embodiment is intended to accommodate 6-inch diameter silicon wafers, the furnace tube 10 has a diameter of about 10-inch, although the particular size is selected according to the intended use of the system. A quartz tubular cantilever 16 holds a large number of these silicon wafers 17, and this tube is moved to a position out of the furnace as seen in FIG. 1 for loading or unloading the wafers or to a position within the furnace as seen in FIG. 2 for performing the high-temperature furnace operation; this position of FIG. 2 is also used for idling the furnace system for extended times, in which case there are no wafers 17 in place. The tubular cantilever 16 is supported at its outward end by a fixture 18 mounted on a track 19 by a slidable dolly 20. Construction of the tubular cantilever and track mechanism is disclosed in the above-mentioned U.S. Pat. Nos. 4,459,104 and 4,543,059.

While the tubular cantilever 16 is within the furnace as seen in FIG. 2, gas flow from the inlet 15 moves in the left-to-right direction indicated by arrows through the tube 16 to provide the desired atmosphere for the reaction or deposition intended. The composition of this gas is selected by the gas source 14 in accordance with the usual practice. Baffles 21 are positioned in the tubular cantilever 16 on both sides of the wafers 17 to retard loss of heat and to ensure adequate reactant mixing, but yet to allow free flow of reactant gases. Although a particular embodiment is shown in the Drawing, many other baffle arrangements are known and can be substituted by one skilled in the art. The spent or exhaust gases are collected in a scavenger box 22, for which an outlet 23 is maintained at below ambient pressure so that effluent reactant gases will be drawn into the scavenger box 22 rather than leaking out into the ambient outside the furnace. When the tubular cantilever 16 is in the outmost position, as seen in FIG. 1, the face of the furnace is open and ambient air or gas can enter the tube furnace as indicated by arrows 24; the scavenger box functions also to draw this ambient air or gas into the scavenger box 22 for exhaust by the outlet 23 rather than allowing it to reach the furnace tube 10. This is undesirable because ambient air, aside from being reactive, contains high levels of particulates and other contaminants. Air should be prevented from entering the furnace tube at all times.

As explained in my copending application Ser. No. 372,663 now U.S. Pat. No. 4,992,044, it is important that radial symmetry be provided for the gas flow into the scavenger box 22 from the furnace tube 10 or from the interior of the tubular cantilever 16. To this end, as illustrated in the detail view of FIG. 4, the openings for the flow of gas are a symmetrical array of openings 25 arranged in two cylindrical rings or bands, with the bands spaced apart by about a 4-inch distance. In one embodiment, there are sixteen of these openings 25, arrayed in two bands of eight each. The number and size of openings, their spacing, etc., are dependent upon the particular size of the furnace, gas flow rates, and the like. The openings 25 are formed in a cylindrical quartz inner liner 22a of the scavenger box 22; the fact that this section is made of quartz reduces contamination considerably, since a stainless steel tube would be susceptible to corrosion due to exiting chlorine-containing chemicals and thus would cause a contamination concern. The ends of the scavenger box 22 must be sealed so as to be airtight to prevent gases from exiting the scavenger box 22 from any channel other than the openings 25.

Referring again to FIG. 1, at the outer end of the tubular cantilever 16 is a cylindrical quartz section 26 having a pair of flanges 27, serving as an extension of the tubular cantilever 16, and this section has a number of symmetrically-disposed openings 28, also seen in the section view of FIG. 5, which provide radially-symmetrical flow of exhaust gases, acting together with the two rows of openings 25 of the scavenger box 22. In the example embodiment four of these openings 28 are provided, although their particular number, size and configuration, i.e., the number of bands or rings, are dependent upon the factors mentioned above. When the tubular cantilever 16 is inside the furnace 12 as seen in FIGS. 2 or 5, the openings 28 in the end-section 26 are axially positioned about half-way between the positions of the openings 25 in the scavenger box 22.

According to a feature of the invention disclosed in my copending application Ser. No. 372,669, now U.S. Pat. No. 4,950,156, a symmetrical manifold collar 30 surrounds the end of the furnace tube 10 and provides symmetrical injection of inert gas such as nitrogen gas, as indicated by the arrows 31. This injection only occurs when the tubular cantilever 16 is in the outermost position as seen in FIG. 1, or is being moved to or from the position of FIG. 2. According to one embodiment, as seen in FIG. 6, the collar 30 is split into two sections, 30a and 30b, which are rotatable about a hinge-like connection 32, i.e., the two halves 30a and 30b may be opened up to facilitate installation and removal, since the collar 30 must be removed from the furnace tube 10 for cleaning. The collar halves 30a and 30b each consist of a stainless steel, hollow, half-cylindrical section having an inner chamber 33 into which an inert gas is forced from an inlet 34, and having a number of nozzles or holes 35 producing the inwardly-projecting nitrogen curtain as indicated by the arrows 31. The collar halves 30a and 30b can also be made of other materials, such as silicon, silicon carbide, or quartz. The collar can also be of unitary construction with two points for injection of the inert gases. The volume of gas needed to provide the desired inert gas curtain depends upon the various dimensions of the furnace in a particular application, but in the example embodiment is a few hundred liters/minute flowing into the two inlets 34. The inert gas, e.g., nitrogen, exiting from the openings 35 forms a barrier or curtain, which is drawn out by the scavenger box 22 through the two sets of openings 25. Inert gas is also being forced through the furnace tube 10 at this time from the inlet 15, so the interior of the tube 10 is at a higher pressure than the ambient and the interior of the scavenger box 22; these pressure differentials along with the curtain effect are such that ambient air entering as indicated by arrows 24 will not reach the interior of the furnace tube 10 but instead will be harmlessly drawn out by the scavenger box 22.

According to a primary feature of this invention, the shape of the inlet end of the quartz furnace tube 10, between the gas inlet 15 and the cylindrical body of the tube 10 where the wafers will reside, defines a cone-like shape 40. This shape suppresses the formation of recirculating gas cells 41 near the point of injection which form when the inlet 15 admits directly to a cylindrical tube as seen in FIG. 8. That is, the flow of gas passing the sharp corners of the inlet of FIG. 8 results in the formation of recirculating gas cells 41 which form close to the walls of the cylindrical reactor, making it harder to purge the tube when changing from one gas flow to another. The abrupt change in velocity of the incoming gas is illustrated by comparing the cross-sectional area $A_1$ of the inlet 15 to the area $A_2$ of the furnace tube 10; the gas flow obeys the relationship $A_1*V_1=A_2*V_2$ so that if the area $A_2$ is one hundred times that of $A_1$ then the velocity within the inlet 15 will be one hundred times that in the furnace tube 10. This abrupt change is velocity, as well as physical shape and change in volume due to the pressure differential, results in the formation of the recirculating gas cells 41. Also, in going from a pre-oxidation interval to an oxidation step, or in going from an oxidation interval to a post-oxidation step, when the furnace is being used for oxidizing the wafers 17, the improved purging capability of the conical section 40 will reduce the time of process gas overlaps. As has been determined by the prior work of others, the optimum shape for suppressing re-circulation cells of entering reactant gases is obtained by increasing the curvature of the sidewalls of the nozzle in the direction of theoretical flow streamlines.

The conical-like shape 40 in a preferred embodiment extends an axial length "c" as seen in FIG. 1; the length "c" is at least about a length which exceeds the diameter of the tube 10. Particularly, in one embodiment, the length "c" is about 12-inches when the diameter of the tube furnace is 10-inches. The angle between the conical walls in the section 40 and the axis of the tube 10 is about 30° or less in a preferred embodiment. The conical-like shape 40 can be obtained by shaping the quartz tube 10 itself to the desired configuration as seen in FIG. 1, or alternatively as seen in FIG. 9 the furnace tube 10 can be cylindrical with a flat end 44, and filler material 45 of quartz or other material added to create the conical-like shape needed for optimum gas flow.

It is preferable to maintain the outer cylindrical-like geometry of the quartz furnace tube 10 as illustrated in FIG. 9, rather than having a conical shape a seen in FIG. 1, because, from a mechanical standpoint, the cylindrical shape is less susceptible to breakage. Also, from a thermal standpoint, it is common practice to pack the nozzle end of furnace tubes with an insulating material to minimize heat losses from the rear of the furnace. Packing cylindrical-shaped tubes with insulating materials is much easier and more thermally efficient. Furthermore, since most furnaces are constructed for using cylindrical-shaped furnace tubes, the shape of FIG. 9 is more consistent with current furnace hardware, compared to that of FIG. 1.

Manufacturing the nozzle shown in FIG. 9 may be fairly labor intensive and will require a large amount of quartz material as the filler 45 to be able to effectively fill the space inside the tube and make it conical. Furthermore, such a tube would have a large mass and may act as a source of heat dissipation, or at least create thermal inertia. An alternative construction of the conical nozzle of the furnace tube is shown in FIG. 10, where the tube 10 is of cylindrical shape all the way to the end, but has a conical insert 46 to create a same inner conical geometry as FIGS. 1 or 9, to which the inlet 15 is integrally formed, but leaving a hollow interior annular chamber 47. This construction is much lighter since it does not need the filler 45, is easier to construct, and does not have the heat dissipation or inertia that the embodiment of FIG. 9 would have. It is preferable that the end piece 48 of the cylindrical tube 10 does not join with the inlet 15 but instead leaves an annular opening 49 so the chamber 47 is not sealed; if the chamber 47 were sealed then the gases inside the chamber would expand and crack the tube 10, and also the opening 49 is large enough to allow cleaning liquids to drain out when the furnace tube 10 has been removed and is being cleaned in a conventional tube etcher. If the opening 49 is not left, i.e., the end piece 48 extends all the way to the inlet 15, sealing the chamber 47, then the chamber must be evacuated during construction to leave a vacuum.

A typical operating sequence for the tube furnace described above with reference to FIGS. 1 and 2 is set forth in the following Table A. There are three gas sources in this apparatus; first, inert or reactant gas is introduced at the inlet 15 to the furnace tube 10 from the source 14; second, inert gas is introduced at an inlet 50 at the outer end of the tubular cantilever 16 to keep ambient gas from entering the tubular cantilever which can contaminate the wafers during loading, idle or cooldown phases of operation (of course, as mentioned above, if the separate tubular cantilever 16 is not used, then the gas inlet 50 is omitted); and, third, the curtain of inert gas is introduced at the collar 30 through inlets 34. Assuming that the idling condition of the furnace is when the tubular cantilever is inside the furnace, as shown in FIG. 2, and that nitrogen ($N_2$) is flowing through the inlet 15 of the furnace tube 10, the sequence of applying the three gases from the three sources is seen in Table A where the operational terms refer to movement of the tubular cantilever 16:

TABLE A

| Step | Time (Min.) | Tube $N_2$ | Curtain $N_2$ | Tubular Cantilever $N_2$ | Operation |
|---|---|---|---|---|---|
| 0 | — | Yes | No | No | Idle |
| 1 | 20 | Yes | Yes | Yes | Unload (Pullout) |
| (load product wafers 17 into boats and insert boats into tubular cantilever at this time) | | | | | |
| 2 | 20 | Yes | Yes | Yes | Purge |
| 3 | 20 | Yes | Yes | Yes | Load (Push-in) |
| 4 | 30 | Yes | No | No | Temp Ramp-Up |
| 5 | 10 | No (Ox.) | No | No | Oxidation |
| 6 | 30 | Yes | No | No | Anneal |
| 7 | 40 | Yes | No | No | Temp Ramp-Down |
| 8 | 20 | Yes | Yes | Yes | Unload (Pull-out) |
| (remove product wafers 17 from tubular cantilever 16 at this time) | | | | | |
| 9 | 20 | Yes | Yes | Yes | Load (Push-in) |
| 10 | — | Yes | No | No | Idle |

While this invention has been described with reference to a specific embodiment, this description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A thermal processing furnace, comprising:
   a) a furnace tube having an elongated cylindrical heated chamber open at one end for receiving a cylindrical cantilever tube containing a plurality of axially-aligned, spaced-apart semiconductor wafers to be processed;
   b) an inlet for introducing reactant and/or inert gasses into the other end of said cylindrical chamber for directing said gasses into an open end of said cantilever tube to flow axially within said cantilever tube by said wafers to the other end of said cantilever tube, said inlet including a substantially cone-shaped portion to provide a smooth transition from the diameter of said inlet to the diameter of said furnace tube to thereby minimize recirculating gas cells adjacent said inlet, wherein said cone-shaped portion has an axial length greater than the diameter of said furnace tube;
   c) an outlet for removing said gasses from said one end of said cylindrical cantilever tube including a plurality of circumferentially-spaced openings in the cantilever tube and an exhaust chamber surrounding said openings, the exhaust chamber including a plurality of circumferentially-spaced exhaust ports; and a gas inlet surrounding said one end of the cylindrical chamber and having a plurality of inwardly-directed gas jets for providing a gas curtain protecting said one end when said cantilever tube is not within said cylindrical chamber.

2. Apparatus according to claim 1 wherein said furnace tube includes a cylindrical furnace quartz tube, and said inlet is an integral part of said furnace tube.

3. Apparatus according to claim 1 wherein said furnace tube has a cylindrical shape of substantially constant exterior diameter extending from said one end to about the position of said inlet.

4. A furnace for performing high-temperature processes upon a plurality of semiconductor wafers, comprising:
   a) a furnace tube having an elongated cylindrical heated chamber open at one end for receiving said plurality of semiconductor wafers;
   b) cantilever means for supporting said plurality of semiconductor wafers, said cantilever means including a cylindrical tube for enclosing said semiconductor wafers in axial alignment with and spaced apart from one another, said cantilever means including support means at an outer end for axial movement into said chamber for performing said processes and out of said chamber for loading and unloading said semiconductor wafers;
   c) an inlet for introducing reactant and/or inert gasses into the other end of said cylindrical chamber, said inlet including a substantially cone-shaped portion to provide a smooth transition from the diameter of said inlet to the diameter of said tube furnace to thereby minimize re-circulating gas cells in an area adjacent said other end, wherein said cone-shaped portion has an axial length greater than the diameter of said furnace tube, the gasses flowing from said inlet into an open end of said cylindrical tube to flow within said cylindrical tube along the length thereof by said plurality of wafers to the other end of said cylindrical tube;
   d) an outlet for removing said gasses from said one end of said cylindrical tube including a plurality of circumferentially-spaced openings in the cylindrical tube and an exhaust chamber surrounding said openings, the exhaust chamber including a plurality of circumferentially-spaced exhaust ports; and a gas inlet surrounding said one end of the cylindrical chamber and having a plurality of inwardly-directed gas jets for providing a gas curtain protecting said one end when said cantilever means is out of said cylindrical chamber.

5. Apparatus according to claim 4 wherein said furnace tube includes a cylindrical quartz tube, and said inlet is an integral part of said furnace tube.

6. Apparatus according to claim 4 wherein said furnace tube has a cylindrical shape of substantially constant exterior diameter extending from said one end to beyond the position where said inlet joins the interior wall of said furnace tube.

7. A method of operating a thermal processing furnace, comprising the steps of:
   a) loading a plurality of axially-spaced articles to be processed within a cantilever tube into one end of a horizontal furnace tube;
   b) introducing reactant and/or inert gasses by an inlet into the other end of said furnace tube to flow by said articles to said one end axially within said cantilever tube, wherein said inlet includes a cone-shaped portion having an axial length greater than the diameter of said furnace tube;
   c) flowing said gasses from said inlet to said furnace tube through said inlet of gradually increasing diameter to minimize formation of stagnant gas cells adjacent said other end resulting from said step of introducing;
   d) removing said gasses from said one end of said cantilever tube by a plurality of circumferentially-spaced openings in the cantilever tube and an exhaust chamber surrounding said openings, the exhaust chamber including a plurality of circumferentially-spaced exhaust ports; and providing a gas curtain protecting said one end when said cantilever tube is not within said furnace tube by a gas inlet surrounding said one end of the furnace tube and having a plurality of inwardly-directed gas jets.

8. A method according to claim 7 wherein said furnace tube includes a cylindrical quartz tube, and said inlet is an integral part of said furnace tube.

9. A method according to claim 7 wherein said furnace tube has a cylindrical shape of substantially constant exterior diameter extending from said one end to about the position of said inlet.

10. A method of operating a cantilever-type tube furnace for performing high-temperature processes upon a plurality of axially-aligned and spaced-apart semiconductor wafers, comprising the steps of:
   a) loading said plurality of axially-aligned, spaced-apart semiconductor wafers into a tubular cantilever, and supporting said tubular cantilever at an outer end for axial movement into one end of a tube furnace from a loading position spaced from said tube furnace to an operating position within said tube furnace for performing said processes;
   c) introducing reactant and/or inert gasses by an inlet into the other end of said tube furnace while said cantilever tube is in said operating position, wherein said inlet includes a cone-shaped portion having an axial length greater than the diameter of said tube furnace;

d) flowing said gasses from said inlet to said tube furnace through said cone-shaped portion of gradually increasing diameter to minimize formation of stagnant gas cells and eddies adjacent said inlet resulting from said step of introducing, said gasses flowing from said inlet into an open end of said tubular cantilever to flow axially within the tubular cantilever by said wafers to the other end of said tubular cantilever;

d) removing said gasses from said one end of said tubular cantilever by a plurality of circumferentially-spaced openings in the tubular cantilever and an exhaust chamber surrounding said openings, the exhaust chamber including a plurality of circumferentially-spaced exhaust ports; and providing a gas curtain protecting said one end when said tubular cantilever is spaced from said tube furnace by a gas inlet surrounding said one end of the tube furnace and having a plurality of inwardly-directed gas jets.

11. A method according to claim 10 wherein said tube furnace includes a cylindrical quartz tube, and said inlet is an integral part of said tube furnace.

12. A method according to claim 10 wherein said tube furnace has a cylindrical shape of substantially constant exterior diameter extending from said one end to about the position of said inlet.

* * * * *

UNITED STATES PATENT AND TRADEMARK OFFICE
CERTIFICATE OF CORRECTION

PATENT NO. : 5,064,367

DATED : November 12, 1991

INVENTOR(S) : Ara PHILIPOSSIAN

It is certified that error appears in the above-identified patent and that said Letters Patent is hereby corrected as shown below:

On the title page, after item [22] Filed: Aug, 6, 1990, the Related U.S. Application Data should be inserted as follows:
-- Related U.S. Application Data
   [62] Continuation of Ser. No. 372,672, Jun. 28, 1989, abandoned. --."

Column 5, line 53, change "a seen" to --as seen--.

Column 8, line 67, change "c)" to --b)--.

Column 9, line 5, change "d)" to --c)--.

Signed and Sealed this

First Day of June, 1993

Attest:

MICHAEL K. KIRK

Attesting Officer    Acting Commissioner of Patents and Trademarks